United States Patent [19]

Eichelberger

[11] 3,961,252

[45] June 1, 1976

[54] TESTING EMBEDDED ARRAYS

[75] Inventor: Edward B. Eichelberger, Purdy Station, N.Y.

[73] Assignee: International Business Machines Corporation, Armonk, N.Y.

[22] Filed: Dec. 20, 1974

[21] Appl. No.: 534,606

[52] U.S. Cl. .................... 324/73 AT; 235/153 AC; 235/153 AK
[51] Int. Cl.² ........................................ G01R 15/12
[58] Field of Search ................... 324/73, 51, 158 R; 235/153 AC, 153 AK, 153 AM; 340/174 ED

[56] References Cited
UNITED STATES PATENTS

| | | | |
|---|---|---|---|
| 3,387,276 | 6/1968 | Reichow | 235/153 AK |
| 3,631,229 | 12/1971 | Beas | 235/153 AC |
| 3,758,761 | 9/1973 | Henrion | 235/153 AK |

Primary Examiner—R. V. Rolinec
Assistant Examiner—Michael J. Tokar
Attorney, Agent, or Firm—Joseph L. Spiegel

[57] ABSTRACT

An LSI semiconductor device includes a memory array incorporating address and data registers, and associated combinatorial and or sequential logic circuitry. The array is "embedded" in the sense that the memory array is not directly accessible, either in whole or in part, from the input and output terminals or pads of the device. To facilitate testing, the address registers and data registers are converted to counters by the addition of an EXCLUSIVE OR circuit to two or more positions of the register. The address and data registers are stepped through all of their states. The data register counter outputs may then be compared with the array outputs, thereby allowing one to check address selection as well as the ability to write or read at each of the storage locations.

11 Claims, 2 Drawing Figures

3,961,252

TESTING EMBEDDED ARRAYS

BACKGROUND OF THE INVENTION

1. Field of the Invention

This invention relates semiconductor devices so designed and arranged as to facilitate the testing of same. While not so limited the invention is primarily concerned with large scale integrated (LSI) chip or semiconductor devices having memory arrays and similar devices embedded therein, the array incorporating address and data registers.

For purposes of discussion the term "embedded" is defined as that condition of a memory array, circuit element or even a circuit function on an LSI chip, when surrounded by other circuitry on the chip, such that the memory array, circuit element or circuit function is not directly accessible, either in whole or in part, from the input and output terminals or pads of the chip.

A prime problem associated with such devices is the testing of the embedded array and, in particular, in getting the proper test data and address words to the array inputs. When there is a substantial amount of logic surrounding the array the problem is determining what input pattern or sequence of input patterns, if any, can be applied to the primary inputs of the device in order to get the correct pattern at the array, and, thereafter, to obtain meaningful test data results from the device output.

With the advent of large scale integration, the circuit designer as well as the component manufacturer are provided with the ability to increase greatly the number of circuits on a single chip of semiconductor material. But unless some means is provided for permitting testing of circuitry embedded within the chip quality can not be assured. This in turn could limit increases in circuit density.

2. Description of the Prior Art

Of course, the problem of testing LSI chips has been addressed before. One example, is the level sensitive testing technique of E. B. Eichelberger, U.S. Pat. No. 3,761,695 issued Sept. 25, 1973, and assigned to the same assignee as the present invention. M. T. McMahon, Jr., U.S. Pat. No. 3,781,670 issued Dec. 25, 1973, and assigned to the same assignee as the present invention allows a.c. performance testing of an LSI chip during fabrication. R. L. James, U.S. Pat. No. 3,789,205 issued Jan. 29, 1974, and assigned to the same assignee as the present invention, teaches testing individual chips mounted on a planar board while the chips are interconnected so as to perform a desired logical function by electronically isolating the chips and applying test patterns to the input lines of the chips to be tested. R. L. James, U.S. Pat. No. 3,790,885 issued Feb. 5, 1974, and assigned to the same assignee as the present invention, describes a method of testing LSI chips which comprises adding to the chip device, shift register storage means, loading a test pattern into the shift register storage means, applying the test pattern to selected elements of the chip device and monitoring the results.

Still other techniques addressing the problem of testing LSI chips are disclosed in: T. H. Baker, et al., U.S. Pat. No. 3,762,027 issued Oct. 2, 1973, and assigned to the same assignee as the present invention; and, DeWolf, U.S. Pat. No. 3,772,595, issued Nov. 13, 1973.

None of the above, however, provide a solution for the testing of embedded arrays.

SUMMARY OF THE INVENTION

An object of the invention is an LSI semiconductor device of high circuit density.

Another object is such a device allowing testing of memory arrays and the like embedded within said device.

Still another object is such a device that can simplify test data, speed up testing and simplify the tester.

These and other objects are accomplished in accordance with the present invention, one illustrative embodiment of which comprises converting the address registers and data registers to counters by the addition of an EXCLUSIVE OR circuit to two or more positions of the register. The address and data registers are stepped through all of their states. The data register counter outputs may then be compared with the array outputs, thereby allowing one to check address selection as well as the ability to write or read at each of the storage locations.

BRIEF DESCRIPTION OF THE DRAWING

The foregoing and other objects, features and advantages of the invention will be apparent from the following, more particular description of the present invention, as illustrated in the accompanying drawing, wherein.

DESCRIPTION OF THE PREFERRED EMBODIMENT

Figure 1:
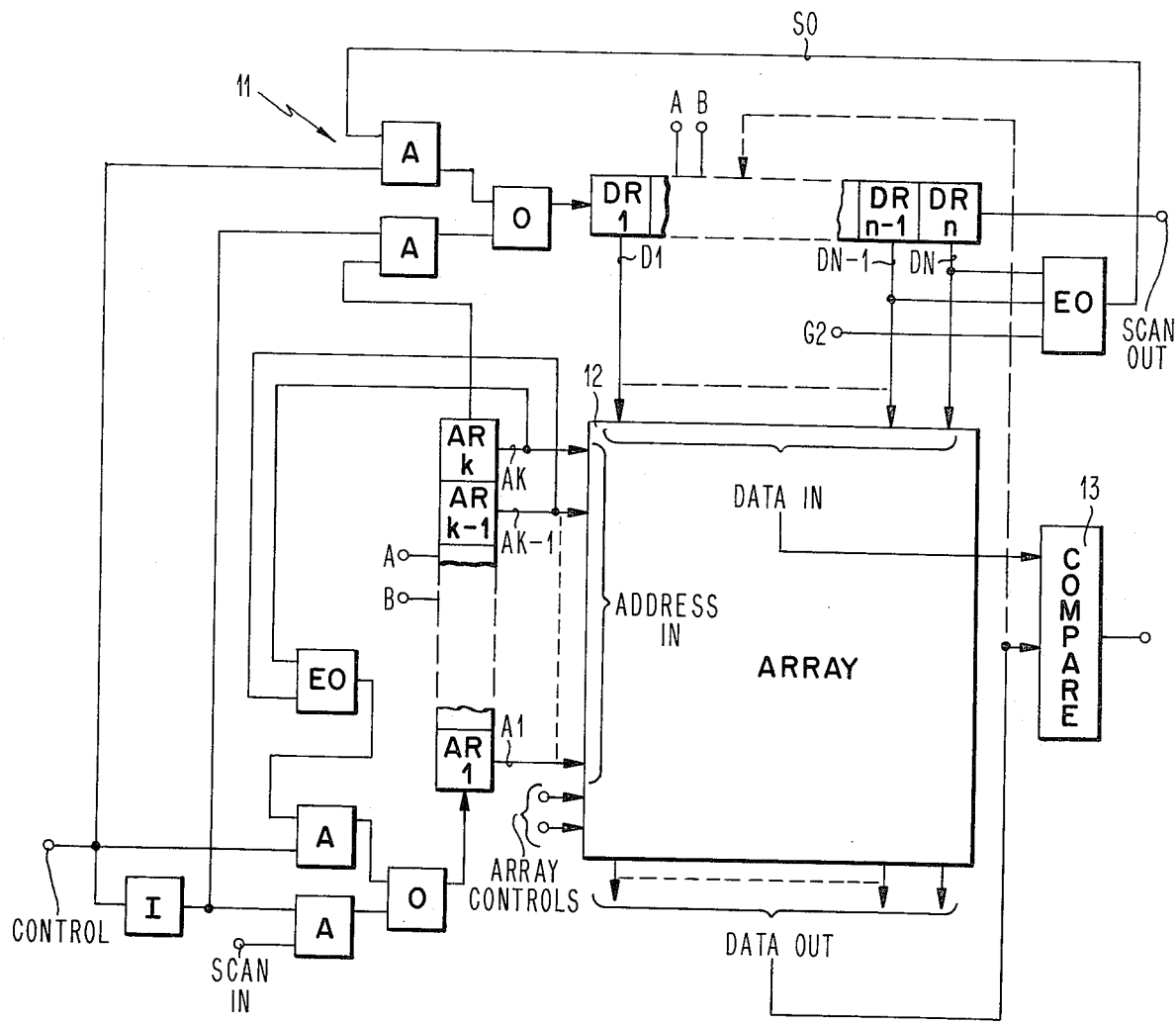
FIG. 1 is a simplified block diagram of an LSI chip or semiconductor device in accordance with the teachings of the present invention; and, FIG. 2 is a simplified block diagram of four positions of a data register with its associated feedback circuitry to illustrate the operation of the present invention.
Figure 2:
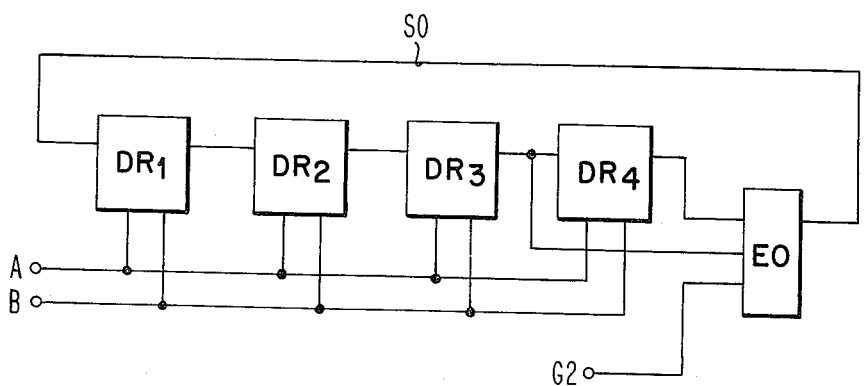

Referring now to FIG. 1 there is illustrated in simple, block diagram form an LSI chip or semiconductor device 11 in accordance with the teachings of the present invention.

Chip 11 typically includes a plurality of interfacing logic circuits (not shown) and a memory array 12. The memory array 12 may typically be 64 × 8, meaning 64 addresses each 8 bits. The invention is not size limited, however, and is applicable to either smaller or larger arrays as well.

The array 12 typically includes a string of shift register latches functioning as address registers and designated AR1...ARK and a string of shift register latches functioning as data registers and designated DR1...DRN.

Interconnections between the address registers and the array 12 are designated A1...AK. Interconnections between the data registers and the array 12 are designated D1...DN.

ARRAY CONTROLS such as a read-write line and a clock line for providing a series of timed pulses to the array, allowing the array operations to be performed extend from primary chip inputs to the array 12.

The device 11 as thus far described is characteristic of the prior art in that the device incorporates an embedded array 12. The array 12 is not directly accessible, either in whole or in part, from the primary inputs and outputs of the device 11 due to intervening logic circuitry (not shown).

To overcome this and in accordance with the teachings of the present invention there is provided means (SCAN IN) for scanning a test pattern into the address (AR1...ARK) and data (DR1...DRN) registers; means (A,B,) for shifting the test pattern through the address registers; feedback means including EXCLUSIVE OR circuitry (EO) for recirculating the register counter output to the register input; control means (inverter block I, AND gates A, A and OR gate 0) for switching the input to the registers between the data being scanned in and the recirculated output from the registers; means G2 for complementing the output of the EXCLUSIVE OR block EO; and, test means 13 for comparing the data in the data registers with the array output.

In an operative mode information from interfacing logic circuitry (not shown) is loaded into the address registers AR1...ARK and into the data registers DR1...DRN via interconnections (not shown). But in the test mode the interface logic circuitry is bypassed and information is scanned in directly from a primary input to the device at SCAN IN.

The first bit of information will be scanned into the first register AR1. Each address register has two latches, a master latch and a slave latch. The master input latch of each register is controlled by a clock line A and the slave output latch which is connected to the input of the next register is controlled by a clock line B. By successively pulsing clock line A and then clock line B bits of information scanned into the first register AR1 and are shifted into the next register AR2 until finally reaching the last address register ARK. There can be a constant shifting of information from one register to the next by means of successive pulsing of clock lines A and B.

With additional shifting the bits of information can be scanned from the address registers and then into and through the data registers DR1...DRN.

In the test mode the information that was initially scanned into the registers may be scanned out to a primary output point designated "SCAN OUT". If the information scanned out differed from the information scanned in this would indicate that there was a problem in the register strings.

In accordance with the teachings of the invention the address (AR1...ARK) and data (AR1...ARN) registers are converted into shift register counters by feeding two or more positions of the register strings into an EXCLUSIVE OR circuit EO. The output from the EXCLUSIVE OR blocks may then be fed back to the register inputs.

Control means that includes an inverter circuit I, a pair of AND blocks A, A, and an OR circuit O are provided. A control signal is provided at the primary input point designated "CONTROL" for determining whether the input to the register strings comes from scan in or the feedback loop from the register output.

In order to test the array a test pattern is loaded into the registers by introducing bits of information from SCAN IN into the register strings at AR1 and shifting the bits by successive pulsing of the clock lines A, B. The address inputs of the array are fed from the address registers AR1...ARK. The data inputs to the array are fed from the data registers DR1...DRN. The registers are converted to counters by the use of an EXCLUSIVE OR gate EO in a feedback loop from the last two positions of the registers for generating signals. Where the string is much larger it may be necessary to select the inputs to the EXCLUSIVE OR block from other than just the last two positions in order to count completely. These signals are then fed into the first position of the register under control of a primary input signal from the primary input point designated CONTROL. Thus when CONTROL = 1 the two registers will count every time the A and B shift clocks are exercised.

The table immediately below shows the $2^N-1$ states that such a counter will produce.

| | DR1 | DR2 | DR3 | DR4 | G2 | SO |
|---|---|---|---|---|---|---|
| 1 | 1 | 1 | 1 | 1 | 0 | 0 |
| 2 | 0 | 1 | 1 | 1 | 0 | 0 |
| 3 | 0 | 0 | 1 | 1 | 0 | 0 |
| 4 | 0 | 0 | 0 | 1 | 0 | 1 |
| 5 | 1 | 0 | 0 | 0 | 0 | 0 |
| 6 | 0 | 1 | 0 | 0 | 0 | 0 |
| 7 | 0 | 0 | 1 | 0 | 0 | 1 |
| 8 | 1 | 0 | 0 | 1 | 0 | 1 |
| 9 | 1 | 1 | 0 | 0 | 0 | 0 |
| 10 | 0 | 1 | 1 | 0 | 0 | 1 |
| 11 | 1 | 0 | 1 | 1 | 0 | 0 |
| 12 | 0 | 1 | 0 | 1 | 0 | 1 |
| 13 | 1 | 0 | 1 | 0 | 0 | 1 |
| 14 | 1 | 1 | 0 | 1 | 0 | 1 |
| 15 | 1 | 1 | 1 | 0 | 0 | 1 |

SO stands for the feedback signal, that is, the output of the EXCLUSIVE OR block.

The table which follows shows the complement count generated by complementing the output of the EO gate.

| | DR1 | DR2 | DR3 | DR4 | G2 | SO |
|---|---|---|---|---|---|---|
| 1 | 0 | 0 | 0 | 0 | 1 | 1 |
| 2 | 1 | 0 | 0 | 0 | 1 | 1 |
| 3 | 1 | 1 | 0 | 0 | 1 | 1 |
| 4 | 1 | 1 | 1 | 0 | 1 | 0 |
| 5 | 0 | 1 | 1 | 1 | 1 | 1 |
| 6 | 1 | 0 | 1 | 1 | 1 | 1 |
| 7 | 1 | 1 | 0 | 1 | 1 | 0 |
| 8 | 0 | 1 | 1 | 0 | 1 | 0 |
| 9 | 0 | 0 | 1 | 1 | 1 | 1 |
| 10 | 1 | 0 | 0 | 1 | 1 | 0 |
| 11 | 0 | 1 | 0 | 0 | 1 | 1 |
| 12 | 1 | 0 | 1 | 0 | 1 | 0 |
| 13 | 0 | 1 | 0 | 1 | 1 | 0 |
| 14 | 0 | 0 | 1 | 0 | 1 | 0 |
| 15 | 0 | 0 | 0 | 1 | 1 | 0 |

The outputs of the data register and the array are both fed to the compare network 13 which indicates an error if they differ in any bit position. The output of the compare circuit is observable on a primary output point.

Thus the general test procedure is to initialize the address counter and the data counter through the shift register with CONTROL = 0. This is followed by switching to the counter mode (CONTROL = 1) and performing the array operations between successive steps in the counter. The counter is stepped by shifting with the A and B clocks.

The address counter allows all addresses to be selected and the data counter allows unique words to be written into each location. The compare network allows an easy check on whether or not the correct bits are being read from the array. This eliminates the need for a complete scan-out for each array read. The ability to count the data register in complement provides an easy method of verifying that both 1's and 0's can be stored in each bit of the array. It also provides an easy way of writing all 1's or all 0's into every word.

A prime feature of the invention is the ability to operate the array at rated speed while executing the various tests. Memory access time can also be tested by observing the output of the compare network. (The compare network will be good only after all data output lines have arrived at their new values.) A.C. dependencies between changes in array inputs and array control signals can also be tested by controlling the shift clocks and the array controls. The quantity and complexity of the array test data is greatly reduced.

The technique has been described with reference to the testing of embedded arrays. The invention is not so limited, however, and is equally applicable where the address registers are fed directly or if the address itself is fed from external inputs and the address registers are at the external inputs for testing purposes. Alternatively, if the array were on a chip by itself with no logic circuitry, the circuitry which permits the testing could be added to the array chip to simplify testing. What has been described, therefore, is a technique for testing an array, whether embedded or not, although major advantages flow when the array is embedded.

Another advantage to the invention is that one can apply pseudo-random test patterns. One can "seed" the data register and the address register with patterns that are random, and then count for $2^n$ cycles and "ripple" through the array. Further one can ripple through more than once reading and writing. Under ordinary conditions the two counts are not the same so that the address register is counting at one rate and the data register is counting at another rate. If one cycles through each word writing a pattern in reading it out and continuing on in that fashion, by the time one gets through every address and starts over again, different words are written the next time. Thus by seeding with but one pattern, one can continually shift, write, do a read-compare and continue on. Thus one applies, with a very limited amount of test data, an almost unlimited number of test patterns.

In the event that some defects in the array can cause the data to pass through the array and appear in the same form in the array output, ordinarily that defect would not be detected. In those circumstances to detect the defect one uses complement compares, either in the compare network feeding both polarities of the data register to it so that one can switch from true compare or complement compare or use the complement compare exclusively.

Thus, while the invention has been particularly shown and described with reference to the preferred embodiment thereof, it will be understood by those skilled in the art that various changes in the form and detail and omissions may be made without departing from the spirit and scope of the invention.

What is claimed is:
1. In the testing of a memory array including address and data registers, the improvement comprising:
   means for scanning a test pattern into the address and data registers;
   means for shifting the test pattern through said address and data registers;
   means converting said registers to counters;
   feedback means for recirculating said register counter outputs to said address and data register inputs; and,
   means for testing the output of said memory array.
2. The invention defined by claim 1 including control means for switching the input to said registers between said register counter outputs and said scanning means.
3. The invention defined by claim 1 wherein said testing means includes means for comparing the data register counter outputs with the array output.
4. The invention defined by claim 1 wherein said feedback means includes an EXCLUSIVE OR network.
5. The invention defined by claim 1 including means for complementing the output of said EXCLUSIVE OR network.
6. In an LSI semiconductor device comprising a memory array and including address and data registers, associated logic circuitry and primary access points to and from external circuitry, operatively associated and so arranged as to provide no direct access from said primary access points to all portions of said memory array, the improvement comprising:
   means bypassing said associated logic circuitry for scanning a test pattern into the address and data registers;
   means for shifting the test pattern through said address and data registers;
   means converting said registers to counters;
   feedback means for recirculating said register counter outputs to said address and data register inputs; and,
   means for testing said array output.
7. The invention defined by claim 6 including control means for switching the input to said registers between said register counter outputs and said scanning means.
8. The invention defined by claim 6 wherein said testing means includes means for comparing the data register counter outputs with the array output.
9. The invention defined by claim 6 wherein said feedback means includes an EXCLUSIVE OR network.
10. The invention defined by claim 9 including means for complementing the output of said EXCLUSIVE OR network.
11. In the method of testing a memory array including address and data registers, the improvement comprising;
   scanning a test pattern into the address and data registers;
   shifting the test pattern through said address and data registers;
   converting the registers to counters;
   feeding the register counter outputs to the address and data inputs; and,
   comparing the data register counter outputs with the array output.

* * * * *